(12) United States Patent
Gaff et al.

(10) Patent No.: US 10,095,184 B2
(45) Date of Patent: Oct. 9, 2018

(54) MECHANICAL OSCILLATOR AND ASSOCIATED PRODUCTION METHOD

(71) Applicant: TRONICS'S MICROSYSTEMS, Crolles (FR)

(72) Inventors: Vincent Gaff, Brie (FR); Pierre-Marie Visse, Grenoble (FR); Luca Ribetto, Voiron (FR)

(73) Assignee: TRONIC'S MICROSYSTEMS, Crolles (FR)

( * ) Notice: Subject to any disclaimer, the term of this patent is extended or adjusted under 35 U.S.C. 154(b) by 0 days.

(21) Appl. No.: 15/544,754

(22) PCT Filed: Feb. 12, 2016

(86) PCT No.: PCT/FR2016/050333
§ 371 (c)(1),
(2) Date: Jul. 19, 2017

(87) PCT Pub. No.: WO2016/128694
PCT Pub. Date: Aug. 18, 2016

(65) Prior Publication Data
US 2018/0004161 A1 Jan. 4, 2018

(30) Foreign Application Priority Data

Feb. 13, 2015 (FR) ..................... 15 51233

(51) Int. Cl.
*G04B 17/04* (2006.01)
*G04B 17/06* (2006.01)
(Continued)

(52) U.S. Cl.
CPC ........... *G04B 17/066* (2013.01); *G04B 17/04* (2013.01); *G04B 17/22* (2013.01)

(58) Field of Classification Search
CPC ...... G04B 17/04; G04B 17/066; G04B 17/22; F01F 1/021
See application file for complete search history.

(56) References Cited

U.S. PATENT DOCUMENTS 7,077,562 B2* 7/2006 Bourgeois ............... F16F 1/021
267/166
8,296,953 B2* 10/2012 Buhler ................. G04B 17/066
29/896.3

(Continued)

FOREIGN PATENT DOCUMENTS

| CH | 699780 A2 | 4/2010 |
|---|---|---|
| CH | 701605 A2 | 2/2011 |

(Continued)

OTHER PUBLICATIONS

International Search Report issued in PCT/FR2016/050333, dated Jun. 7, 2016.

*Primary Examiner* — Vit W Miska
(74) *Attorney, Agent, or Firm* — Marshall, Gerstein & Borun LLP

(57) ABSTRACT

A mechanical oscillator endowed with a strip, with the aforesaid strip incorporating a first silicon layer having a crystal lattice extending along a first direction of one plane, a thermal compensation layer composed of a material having a Young's modulus thermal coefficient of opposite sign to that of the silicon, and a second silicon layer having a crystal lattice extending in a second direction of the plane, with the first and direction being offset at an angle of 45° within the plane of the layers, and with the thermal compensation layer extending between the first and second silicon layers.

15 Claims, 6 Drawing Sheets

(51) Int. Cl.
*F16F 1/02* (2006.01)
*G04B 17/22* (2006.01)

(56) References Cited

U.S. PATENT DOCUMENTS

| | | | | |
|---|---|---|---|---|
| 8,425,110 B2* | 4/2013 | Zaugg | ............... | G04B 17/066 |
| | | | | 368/175 |
| 8,641,023 B2* | 2/2014 | Charbon | ............... | F16F 1/024 |
| | | | | 267/180 |
| 9,030,920 B2* | 5/2015 | Hessler | ............... | G04B 17/063 |
| | | | | 368/158 |
| 2005/0068852 A1* | 3/2005 | Hessler | ............... | G04B 17/222 |
| | | | | 368/139 |

FOREIGN PATENT DOCUMENTS

| | | |
|---|---|---|
| CH | 708067 B1 | 11/2014 |
| EP | 1422436 A1 | 5/2004 |
| EP | 1791039 A1 | 5/2007 |
| EP | 2215531 A1 | 8/2010 |
| WO | WO-2015011637 A2 | 1/2015 |

\* cited by examiner

MECHANICAL OSCILLATOR AND ASSOCIATED PRODUCTION METHOD

TECHNOLOGICAL FIELD

This disclosure concerns the domain of mechanical oscillators, and a process for manufacturing such a mechanical oscillator. The disclosed embodiments have a particularly advantageous application for spiral springs intended to be used in the rocker arm of a mechanical clockwork assembly such as a watch.

BACKGROUND

A mechanical oscillator is a device that allows the movement of a weight to be maintained in relation to a stable point, under the effect of a force. The instantaneous force applied by the mechanical oscillator on the weight depends on several parameters, including the stiffness of the material of which the mechanical oscillator is composed. The mechanical oscillator is conventionally composed of a strip that can take a large variety of forms, such as a straight segment, a helicoid or a spiral.

Certain precision applications, such as the spiral springs intended to equip the rocker arm of a mechanical clockwork assembly, require a strip in the form of a spiral of which the stiffness varies as little as possible as a function of temperature. The stiffness of a spring of spiral type is defined by:

$$K = \frac{M}{\varphi}$$

where:
φ, the angle of twisting of the spring, and
M, the return torque of the spiral spring.
The equation for this return torque for a strip composed of a specific material is defined by:

$$M = \frac{E}{L\left(\frac{w^3 t}{12}\varphi\right)}$$

where:
E is the Young's modulus of the material employed for the strip;
L is the length of the strip;
w is the width of the strip; and
t is the thickness of the strip.

The specific frequency of resonance of the spiral is proportional to the square root of its stiffness. Consequently, the frequency of the spiral is proportional to the square root of the Young's modulus of the material of the strip. Thus, if the Young's modulus varies as a function of temperature, the frequency of the spiral will also vary as a function of temperature. With a low variation in temperature, the frequency of the spiral therefore depends on the first order of variation in temperature of the Young's modulus. It is thus acknowledged that the following equation shows the variations in Young's modulus as a function of temperature:

$$E = E_0(1 + \alpha_E(T - T_0))$$

where:
$\alpha_E$ is the thermal coefficient of the Young's modulus;
E is the Young's modulus at the temperature T, and
$E_0$ is the Young's modulus at the temperature $T_0$.

It is known to manufacture mechanical oscillators using alloys that are complex, both in terms of the number of components (iron, carbon, nickel, chrome, tungsten, molybdenum, beryllium, niobium, etc.), and in terms of the metallurgical processes used to obtain an auto-compensation of variations in the modulus of elasticity of the metal, by combining two contrary influences such as that of temperature and that of the magneto-constriction (contraction of magnetic objects under the effect of magnetization). However, these metal oscillators are difficult to manufacture. First of all, this is because of the complexity of the processes used for producing the alloys; the intrinsic mechanical properties of the metal are not constant from one production run to another. Additionally, the adjustment—which is the technique enabling one to ensure that the oscillator is regular—is fastidious and slow.

This operation requires many manual actions, and many defective parts have to be discarded. For these reasons, production is costly and maintaining constant quality is an ongoing challenge.

It is also known to produce mechanical oscillators by engraving a silicon wafer, to improve the regularity and precision of design. The processes for producing such mechanical oscillators generally use monocrystalline silicon wafers. Therefore, these mechanical oscillators have a monocrystalline direction that is predetermined by the silicon wafer used—for instance, all <100> directions. However, the Young's modulus of monocrystalline silicon is not the same in all the directions of the material, and this gives rise to a difference of mechanical behavior according to the axis of movement.

Swiss patent application no 699 780 concerns a mechanical oscillator of spiral type, produced from a monocrystalline silicon wafer. The temperature variations of the Young's modulus of the spiral-form strip are compensated by two amorphous layers located within the silicon strip, and of which the thermal coefficient of the Young's modulus is opposed to that of the silicon. This document does not compensate the temperature variations of the Young's modulus in the same way in multiple directions of the plane of the monocrystalline silicon wafer.

European patents no 1 422 436 and no 2 215 531 also address a mechanical oscillator of spiral type produced from a monocrystalline silicon wafer. The temperature variations of the Young's modulus are compensated by a layer of amorphous silicon oxide wrapped around a silicon strip. The thermal coefficient of the Young's modulus for silicon is $-64 \cdot 10-6K-1$, and the thermal coefficient of the Young's modulus for silicon oxide is $187.5 \cdot 10-6K-1$ at an ambient temperature of around 20° C.

European patent no 1 422 436 proposes compensating the variations in the Young's modulus of the silicon strip in multiple directions of a plane by means of a modulation of the width of the strip as a function of the stresses anticipated by the strip. This solution is particularly complex to implement, because it requires knowing all the stresses expected on the strip, and adapting the shape of the strip accordingly.

European patent no 2 215 531 proposes resolving this problem by using a special silicon strip oriented in accordance with the crystallographic axis {1,1,1}, which has similar mechanical characteristics in multiple directions of a plane. This implementation requires a very special silicon that greatly constrains the process of production of the mechanical oscillator.

The technical problem addressed herein therefore consists in achieving a monocrystalline silicon mechanical oscillator that is simple to manufacture, and of which the mechanical characteristics are the same in all the directions of a plane. Furthermore, the disclosed embodiments also aim to limit the variations in mechanical characteristics as a function of temperature.

SUMMARY OF THE DISCLOSURE

The embodiments disclosed herein cater to this technical problem by assembling two layers of monocrystalline silicon of which the crystal lattice directions are offset by interposing a thermal compensation layer.

According to a first aspect, a mechanical oscillator provided with a strip that has a first layer of silicon incorporating a crystal lattice extending in one first direction of a plane, a thermal compensation layer made of a material having a Young's modulus thermal coefficient of opposite sign to that of silicon, and a second silicon layer having a crystal lattice extending in a second direction of the plane, with the first and second directions being offset at an angle of 45° within the plane of the layers, and with the thermal compensation layer extending between the first and second layers of silicon.

For the purposes of the disclosure, a strip is therefore a composite structure incorporating several layers of materials, and not a monolithic structure.

The disclosed embodiments thus make it possible to obtain a mechanical oscillator of which the mechanical behavior is identical in all the directions of the plane, regardless of the temperature. The variation in Young's modulus for monocrystalline silicon in multiple directions of the material is compensated by the presence of two identical monocrystalline silicon layers offset by 45°. The influence of the thermal coefficient of the Young's modulus on the mechanical characteristics as a function of temperature is restricted by means of the thermal compensation layer. Thus, the strip generally behaves in essentially the same manner, whatever the direction of the plane under consideration and whatever the temperature. By choosing, for example, an isotropic thermal compensation layer within the plate (or amorphous), the layer also has a thermal coefficient of the Young's modulus that is also isotropic. This thermal compensation layer thus uniformly compensates for the variations in stiffness of the strip. Furthermore, it is not necessary to provide an isotropic monocrystalline network in a plane that would require a complex manufacturing process.

According to one implementation, the said strip incorporates a third silicon layer incorporating a crystal lattice that extends in a third direction parallel to the direction of the first silicon layer, and a second thermal compensation layer made of a material having a thermal coefficient of the Young's modulus of opposite sign to that of the silicon, with each thermal compensation layer being positioned between two superimposed layers of silicon, and with the direction of the silicon layer positioned between the other two silicon layers being offset by an angle of 45° in relation to the direction of the other two silicon layers. This implementation restricts the thickness of each thermal compensation layer by employing more layers.

According to one implementation, the said strip incorporates an outer layer made of a material having a thermal coefficient of the Young's modulus of opposite sign to that of the silicon. Using the thermal compensation layer extending between the first and second layers of silicon makes it possible to restrict the thickness of the outer layer.

According to one implementation, the thermal compensation layer of which the material has a thermal coefficient of the Young's modulus of opposite sign to that of the silicon is made of silicon oxide.

This implementation makes it possible to facilitate the manufacturing process of the mechanical oscillator because the silicon oxide is obtained from the silicon in contact with air or in an oxidation chamber.

According to one implementation, the volume ratio of the material having a thermal coefficient of the Young's modulus of opposite sign to that of the silicon to the silicon layers depends on the nature of the material. For example, for silicon oxide, it is between 20% and 30% —preferably around 26% —at an ambient temperature of about 20° C. This implementation makes it possible to effectively compensate for the thermal sensitivity of the strip. Furthermore, using a thermal compensation layer extending between the first and second silicon layers makes it possible to restrict the thickness of the outer layer, which reduces manufacturing time and increases the quality of the outer layer.

According to one implementation, the mechanical oscillator is a spiral spring designed to equip the rocker arm of a mechanical clockwork assembly being composed of a spiral strip. The disclosed embodiments are particularly suitable for spiral springs used for the manufacturing of precision watches. The disclosed embodiments are also suitable for the production of other mechanical oscillators or resonators—of tuning fork type, for instance.

According to a second aspect, a method for manufacturing such a mechanical oscillator described above.

According to one implementation, the process includes the following steps: deposit a thermal compensation layer on a silicon layer of a first silicon wafer of silicon-on-insulator type; etch the pattern of the mechanical oscillator onto the thermal compensation layer, and onto the silicon layer of the first silicon-on-insulator wafer; seal a second silicon-on-insulator wafer onto the first silicon wafer, with a rotation of 45° in relation to the first silicon wafer, so that one silicon layer of the second silicon wafer is in contact with the thermal compensation layer; remove a substrate and an insulator layer from the first silicon-on-insulator wafer; etch the silicon layer of the second silicon wafer, using the first silicon layer as a mask;

and remove a substrate and an insulator layer from the second silicon-on-insulator wafer; the first and second silicon-on-insulator wafers are manufactured with a substrate topped with an insulating layer followed by a monocrystalline silicon layer.

For the purposes of the disclosure, the phrase "deposit a layer of material" means the processes consisting in adding material by deposition, adding material by growth and transformation of an existing layer, or transferring an auxiliary layer by sealing the auxiliary layer.

According to one implementation, the method includes the following steps: deposit a first part of a thermal compensation layer onto a silicon layer of a first silicon-on-insulator wafer; deposit a second part of the thermal compensation layer onto a silicon layer of a second silicon-on-insulator wafer; etch the pattern of the mechanical oscillator onto the first part of the thermal compensation layer, and onto the silicon layer of the first silicon-on-insulator wafer; etch the pattern of the mechanical oscillator onto the second part of the thermal compensation layer, and onto the silicon layer of the second silicon-on-insulator wafer; seal the second silicon wafer onto the first silicon wafer, with a rotation of 45° in relation to the first silicon wafer, such that the two parts of the thermal compensation layer are in contact; remove a substrate and an insulator layer of the second silicon-on-insulator wafer; and remove a substrate and an insulator layer from the first silicon-on-insulator wafer; the first and second silicon-on-insulator wafers are composed of a substrate topped by an insulator layer followed by a monocrystalline silicon layer.

According to one implementation, the process includes the following steps: etch the pattern of the mechanical oscillator onto a first silicon layer, a second insulator layer and a second silicon layer of dual silicon-on-insulator type; and remove a substrate and a first insulator layer from the silicon wafer; the first dual silicon-on-insulator wafer is composed of a substrate topped with a first insulator layer, a first monocrystalline silicon layer, a second insulator layer and a second monocrystalline silicon layer; the first and second silicon layers of the dual silicon-on-insulator wafer have crystal lattices of which the directions are offset at a 45° angle.

According to one implementation, the process includes the following steps: etch the pattern of the mechanical oscillator onto a second silicon layer and second insulator layer of a first dual silicon-on-insulator wafer; seal a second silicon wafer onto the second silicon layer of the first silicon wafer; remove a substrate and a first insulator layer from the first silicon wafer; etch the pattern of the mechanical oscillator onto a first silicon layer of the first silicon wafer; and remove the second silicon wafer, with the first dual silicon-on-insulator wafer consisting of a substrate topped by a first insulator layer, a first monocrystalline silicon layer, a second insulator layer, followed by a second monocrystalline silicon layer; the first and second silicon layers of the dual silicon-on-insulator wafer have crystal lattices of which the directions are offset at a 45° angle; the second silicon wafer is composed of a single silicon layer that may or may not be topped with a thermal compensation insulator layer.

According to one implementation, the process comprises the following steps: deposit a thermal compensation layer onto a silicon layer of a first silicon-on-insulator wafer; etch the pattern of the mechanical oscillator onto the thermal compensation layer and onto the silicon layer of the first silicon wafer; seal a second silicon wafer onto the first silicon wafer, with a 45° rotation in relation to the first silicon wafer, such that the second silicon wafer is in contact with the thermal compensation layer; thin the second silicon wafer; etch the pattern of the mechanical oscillator onto the second silicon wafer; and remove a substrate and an insulator layer of the first silicon wafer; the first silicon-on-insulator wafer is composed of a substrate topped with an insulator layer followed by a monocrystalline silicon layer; the second silicon wafer is composed of a single silicon layer that may or may not be topped with a thermal compensation insulator layer.

According to one implementation, the process includes the following steps: thin a substrate of a silicon-on-insulator wafer; etch the pattern of the mechanical oscillator onto a silicon layer of the silicon wafer; deposit a structuring layer onto the substrate of the silicon wafer; etch the pattern of the mechanical oscillator onto a substrate and an insulator layer of the silicon wafer, using the first silicon layer as a mask; and remove the structuring layer of the substrate of the silicon wafer;

the silicon-on-insulator wafer is composed of a silicon substrate topped with an insulator layer followed by a monocrystalline silicon layer; the first silicon layer and the silicon substrate of the silicon wafer have crystal lattices of which the directions are offset at a 45° angle.

According to one implementation, the process includes an additional stage of oxidation of the strip.

According to one implementation, at least one silicon wafer is of the triple silicon-on-insulator type composed of a substrate topped by a first insulator layer, a first monocrystalline silicon layer, a second insulator layer, a second monocrystalline silicon layer followed by a third monocrystalline silicon layer; the first and second silicon layers of the dual silicon-on-insulator wafer have crystal lattices of which the directions are offset at a 45° angle.

BRIEF DESCRIPTION OF THE DRAWINGS

The manner of implementation of the disclosed embodiments and the advantages accruing therefrom will come clearly to the fore in the implementation that follows, with the aid of the appended drawings, in which

FIG. 1 is a cross-sectional view of a strip of a mechanical oscillator, in accordance with a first embodiment;

FIG. 2 is a schematic representation of the various directions of the axes of the crystal lattice on a silicon wafer of <100> type;

FIG. 3 is a representation of the mechanical characteristics of one of the two silicon layers of the strip in FIG. 1, according to the direction in the plane of the center line of the crystal lattice;

FIG. 4 is a cross-sectional view of a strip of a mechanical oscillator according to a second embodiment;

FIG. 5 is a cross-sectional view of a strip of a mechanical oscillator according to a third embodiment;

FIG. 6 is a cross-sectional view of a strip of a mechanical oscillator according to a fourth embodiment;

FIG. 7 is a schematic illustration of the manufacturing process for the strip in FIG. 1, according to one first embodiment;

FIG. 8 is a schematic illustration of the manufacturing process for the strip in FIG. 1, according to a second embodiment;

FIG. 9 is a schematic illustration of the manufacturing process for the strip in FIG. 1, according to a third embodiment;

FIG. 10 is a schematic illustration of the manufacturing process for the strip in FIG. 1, according to a fourth embodiment;

FIG. 11 is a schematic illustration of the manufacturing process for the strip in FIG. 1, according to a fifth embodiment; and FIG. 12 is a schematic illustration of the manufacturing process for the strip in FIG. 1, according to a sixth embodiment.

DETAILED DESCRIPTION

Figure 1:
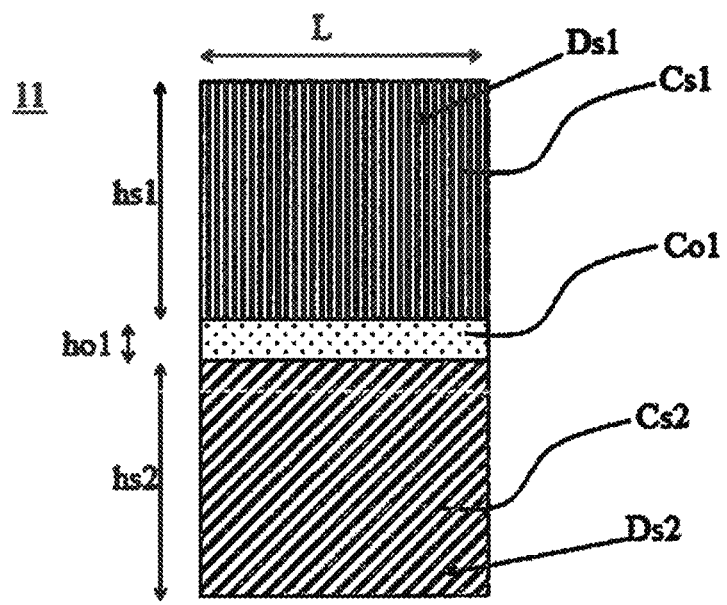
FIGS. 1 to 12 depict the following.

FIG. 1 illustrates a strip (11) of a mechanical oscillator—in the form of a straight segment, a helicoid or a spiral, for example—incorporating a stack of three layers: a first layer of monocrystalline silicon (Cs1) in direct contact with a thermal compensation layer (Co1) in direct contact with a second monocrystalline silicon layer (Cs2). The first silicon layer (Cs1) extends over a height hs1 and over the entire width L of the strip (11). The second silicon layer (Cs2) extends over a height hs2 essentially the same as height hs1, and over the entire width L of the strip (11). The thermal compensation layer (Co1) extends over a height hot that is much smaller than the two heights hs1 and hs2, and over the entire width L of the strip (11).

The two silicon layers (Cs1, Cs2) incorporate two identical crystal lattices. Each crystal lattice of each silicon layer (Cs1, Cs2) has a predetermined direction (Ds1, Ds2). The term "direction" of the silicon layers is deemed to mean the direction of a crystal lattice in which the crystal lattice has a maximal Young's modulus in the plane of the corresponding silicon layer (Cs1, Cs2).

The hatchings in FIGS. 1, 4, 5 and 6 provide a schematic illustration of the offsets between the directions (Ds1, Ds2 and Ds3).

However, the offsets between the directions (Ds1, Ds2 and Ds3) are in the plane of the silicon layers (Cs1, Cs2 and Cs3) and, therefore, are not visible in the same way in a true-to-life cross-sectional view of the strip (11). The phrase "a crystal lattice extends in one direction" means that the crystal lattice incorporates a crystalline structure of which the maximum Young's modulus is attained in the predetermined direction.

Figure 2:
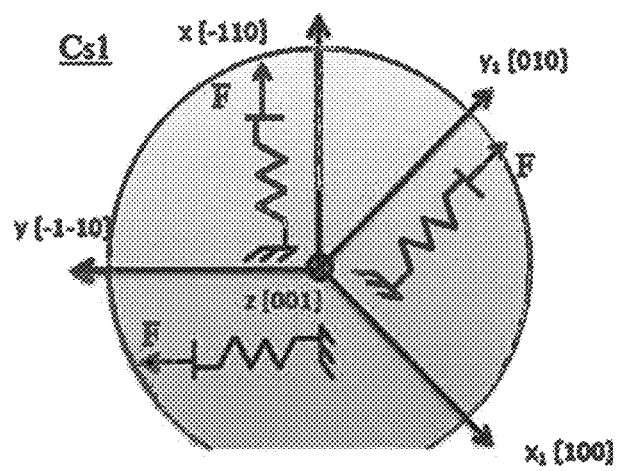
Figure 3:
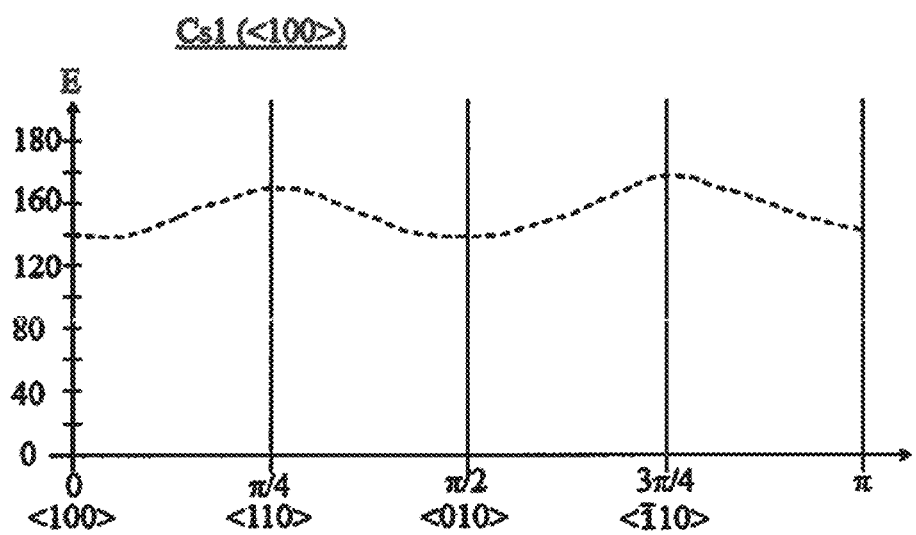

FIG. 2 illustrates a monocrystalline network, of <100> type, of the first silicon layer (Cs1) modeled in accordance with three linear springs. For a crystal lattice of the <100> type, the mechanical strength of the first silicon layer (Cs1) in the crystalline direction [−110] of the x axis, and in the crystalline direction [−1−10] of they axis is greater than the mechanical strength in the crystalline directions [100] of the x1 axis and [010] of the y1 axis. FIG. 3 illustrates the mechanical characteristics of a wafer of <100> type, as a function of the angular direction of a force F identified in the plane of the crystal lattice of <100> type at constant temperature. E represents the variation of the Young's modulus. This mechanical magnitude has local maxima in the <110> and <$\bar{1}$10> directions, and local minima in the <100> and <010> directions. From this, one can thus deduce that the stiffness of the <100>-type crystal lattice of the first silicon layer (Cs1) differs in the x [−110] and y1 [010] directions. This stiffness is identical between the x [−110] and y [−1−10] directions.

Given the thickness of the thermal compensation layer (Co1), the mechanical properties of the strip (11) largely depend on the mechanical properties of the two silicon layers (Cs1, Cs2). If the two silicon layers (Cs1, Cs2) have the same crystalline orientation and the same height, such that hs1=hs2, the strength $F_{tot\ X}$ of the strip (11) in the x [−110] direction is equal to the sum of the strengths (F1, F2) of the two silicon layers (Cs1, Cs2). The Young's modulus $E_{-110}$ in the direction x [−110] of the two silicon layers (Cs1, Cs2) being identical, the strengths F1 and F2 are also identical, such that:

$$F_1 = F_2 = \frac{hs1 \times L \times E_{-110}}{\varepsilon};$$

where ε represents the distortion coefficient.

The strength $F_{tot\ X}$ of the strip (11) in the direction x [−110] is therefore:

$$F_{totX} = F_1 + F_2 = \frac{2 \times hs1 \times L \times E_{-110}}{\varepsilon}.$$

This strength $F_{tot\ X}$ in the x [−110] direction is the same in the Y [−1−10] direction in the case of a single-core spiral.

However, the strength $F_{tot\ y1}$ of the strip (11) in the y1 [010] direction is:

$$F_{toty1} = F_1 + F_2 = \frac{2 \times hs1 \times L \times E_{010}}{\varepsilon}.$$

However, FIG. 3 shows that the Young's modulus $E_{010}$ of the silicon layers (Cs1, Cs2) in the y1 [010] direction is less than the Young's modulus $E_{-110}$ of the silicon layers (Cs1, Cs2) in the x [−110] direction, which gives rise to a difference in strengths is the x [−110] and y1 [010] directions. Thus, the strength $F_{tot\ X}$ of the strip (11) in the x [−110] direction is greater than the strength $F_{tot\ y1}$ of the strip (11) in the y1 [010] direction. The strip (11) thus has a weakness in its strength in the y1 [010] direction.

The contemplated embodiments compensate for this difference in strength by shifting the directions (Ds1, Ds2) of the silicon layers (Cs1 and Cs2) by a 45° angle in the plane of the silicon layers (Cs1, Cs2). Thus, the Young's modulus in a given direction is different between the two layers (Cs1 and Cs2). For example, in the y1 [010] direction, the Young's modulus $E_{-110}$ of the first silicon layer (Cs1) differs from the Young's modulus $E_{010}$ of the second silicon layer (Cs2). The strength $F_{tot\ X}$ of the strip (11) in the direction x [−110] is therefore:

$$F_{totX} = F_1 + F_2 = \frac{hs1}{\varepsilon} \times L \times (E_{-110} + E_{010}).$$

The strength $F_{tot\ y1}$ of the strip (11) in the y1 [010] direction is:

$$F_{toty1} = F_1 + F_2 = \frac{hs1}{\varepsilon} \times L \times (E_{010} + E_{1-10}).$$

Given that $E_{1-10}$ is equal to $E_{-110}$, the strengths are identical in the two directions x [−110] and y1 [010]. The structure of the strip (11) in FIG. 1 thus provides identical mechanical characteristics in all the directions x, y and y1 of the crystal lattice.

The thermal compensation layer Co1 is composed of a material having a thermal coefficient of the Young's modulus of opposite sign to that of the silicon, such that the variation in mechanical strength of the silicon layers (Cs1, Cs2) as a function of temperature is at least partially compensated by the thermal compensation layer (Co1). The thermal compensation layer (Co1) is preferably made of silicon oxide. The thermal coefficient of the Young's modulus for silicon is −64·10-6K-1, while the thermal coefficient of the Young's modulus for silicon oxide is 187.5·10-6K-1 at an ambient temperature of around 20° C. Thus, to compensate—at least partially—the variation in mechanical strength of the silicon layers (Cs1, Cs2) as a function of temperature, the volume ratio between the thermal compensation layer (Co1) and the silicon layers (Cs1, Cs2) is at least 20% at an ambient temperature of around 20° C. In FIG. 1, the surface area of the ho1.L section is therefore at least 20% of the surface area of the sections L.hs1 and L.hs2.

Figure 4:
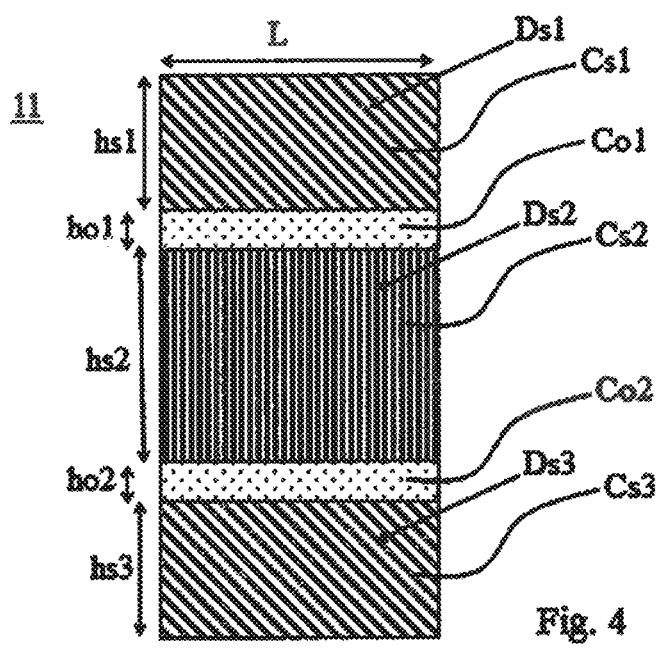

FIG. 4 illustrates an embodiment in which the strip (11) incorporates three silicon layers (Cs1, Cs2, Cs3) intersected by two thermal compensation layers (Co1, Co2). The first and third silicon layers (Cs1, Cs3) have crystal lattices oriented in the same direction (Ds1, Ds3). The second silicon layer Cs2 located between the first and third silicon layer (Cs1, Cs3) incorporates a crystal lattice of which the direction (Ds2) is offset at a 45° angle to the directions (Ds1, Ds3). To procure identical mechanical characteristics in all directions (x, y and y1) of the crystal lattice, the height hs2 of the second silicon layer (Cs2) must be equal to the sum of the heights hs1 and hs3 of the other two silicon layers (Cs1, Cs3). In order to compensate—at least partially—for temperature variation, the sum of the heights ho1 and h02 must be at least 20% of the sum of the heights hs1, hs2 and hs3 in the case of silicon oxide.

Figure 5:
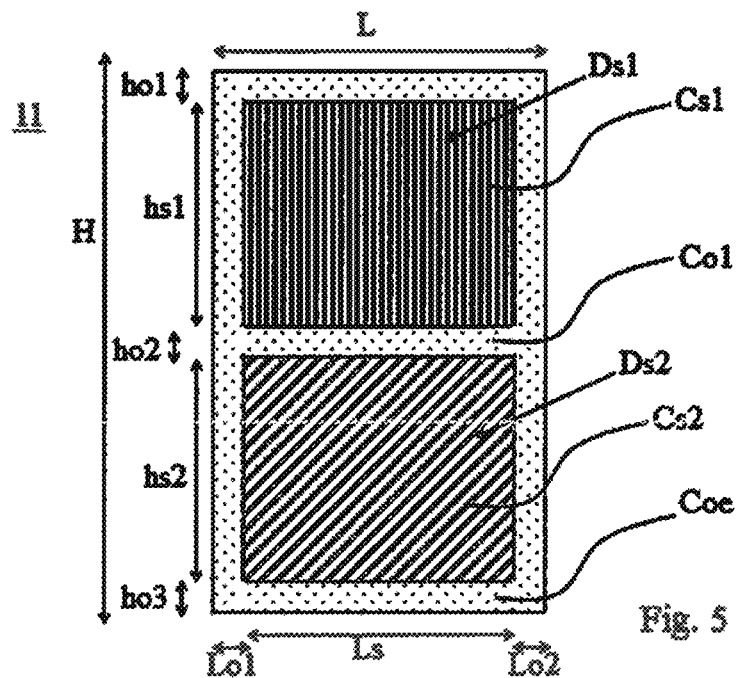
Figure 6:
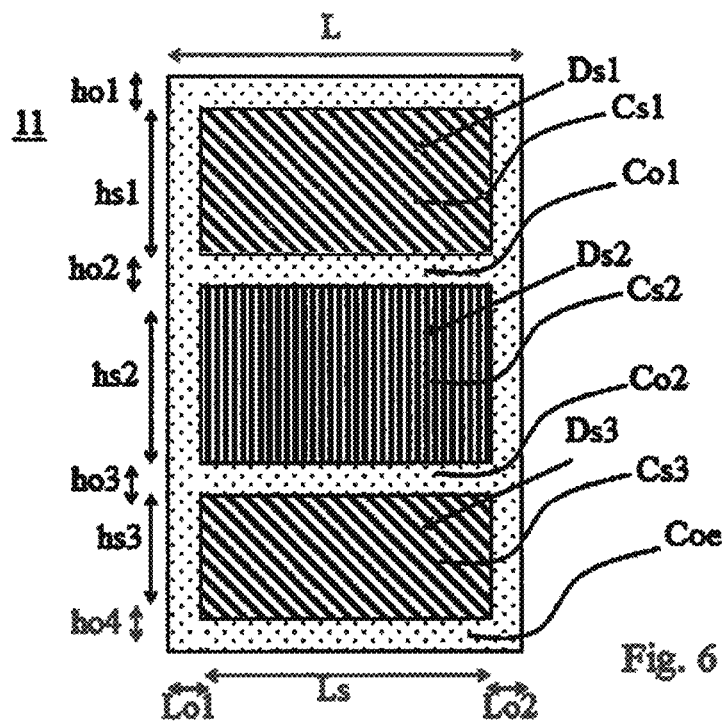
Figure 7:
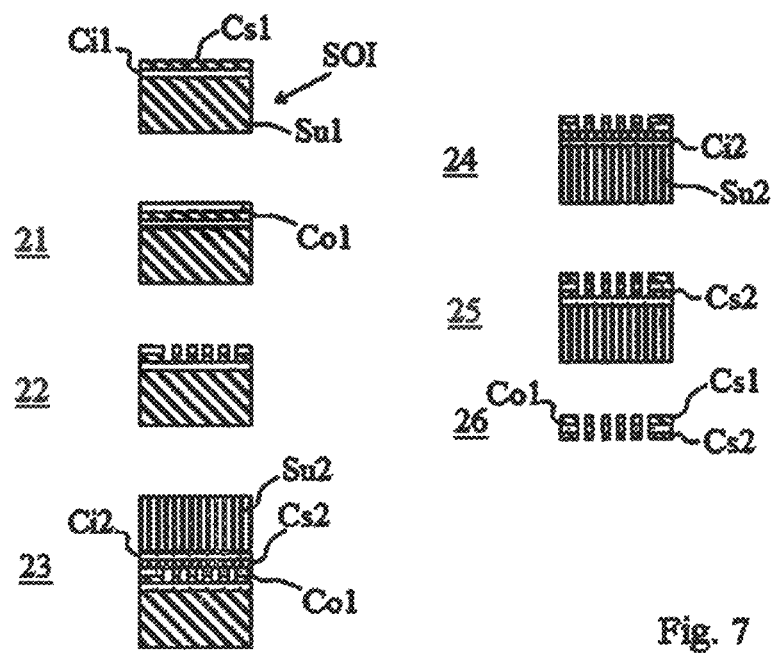

FIGS. 5 and 6 illustrate a variant in which a thermal compensation layer is also positioned around the strip (11) of FIGS. 1 and 4. This implementation makes it possible to restrict the thickness of the thermal compensation layer (Co1) located between the silicon layers (Cs1, Cs2). For example, in the case of FIG. 5, the surface area of the thermal compensation layer includes the following areas:

Ho1.L, the area of the outer layer (Coe) above the strip (11);

Lo1.H, the area of the outer layer (Coe) on the left of the strip (11);

Lo2.H, the area of the outer layer (Coe) on the right of the strip (11);

Ho3.L, the area of the outer layer (Coe) below the strip (11), and

Ho2.L, area of the layer (Co1) between the silicon layers (Cs1, Cs2).

The sum of these surface areas must also be equal, in the case of silicon oxide, to at least 20% of the sum of the surfaces hs1.Ls and hs2.Ls of the silicon layers (Cs1, Cs2), to compensate for temperature variation. Thus, the thickness of the thermal compensation layers—namely the internal layer (Co1) and the outer layer (Coe)—is smaller than the implementation in FIG. 1. FIG. 6 illustrates an identical implementation in which the strip incorporates three silicon layers (Cs1, Cs2 and Cs3) as illustrated in FIG. 4.

FIGS. 7 to 12 illustrate manufacturing processes for the strip (11) in FIG. 1. The process in FIG. 7 uses two silicon wafers of silicon type on insulator SOI. Each silicon-on-insulator (SOI) wafer incorporates a substrate (Su1, Su2) topped with an insulator layer (C1, Ci2) followed by monocrystalline silicon layer (Cs1, Cs2). The substrate (Su1, Su2) can be made of silicon. In a first step (21), a thermal compensation layer (Co1) is deposited on the silicon layer (Cs1) of the first SOI wafer. In a second step (22), a pattern of the mechanical oscillator is etched on the thermal compensation layer (Co1) and on the silicon layer (Cs1). In a third step (23), the silicon layer (Cs2) of the second wafer is sealed onto the thermal compensation layer (Co1). The second wafer is offset by an angle of 45° in relation to the first wafer before this sealing step (23), so that the directions (Ds1, Ds2) of the crystal lattices are also offset by a 45° angle. In one step (24), the assembly is turned over and the substrate (Su1) and the insulator layer (01) of the first wafer are removed. In one step (25), the silicon layer (Cs2) of the second wafer is etched with the pattern of the mechanical oscillator, using the first silicon layer as etching mask. The etching can be performed by a deep reactive ion etching technique (also known as DRIE for "Deep Reactive Ion Etching"). The substrate (Su2) and the insulator layer (Ci2) of the second silicon wafer are then removed in a step (26), to release the mechanical oscillator.

Figure 8:
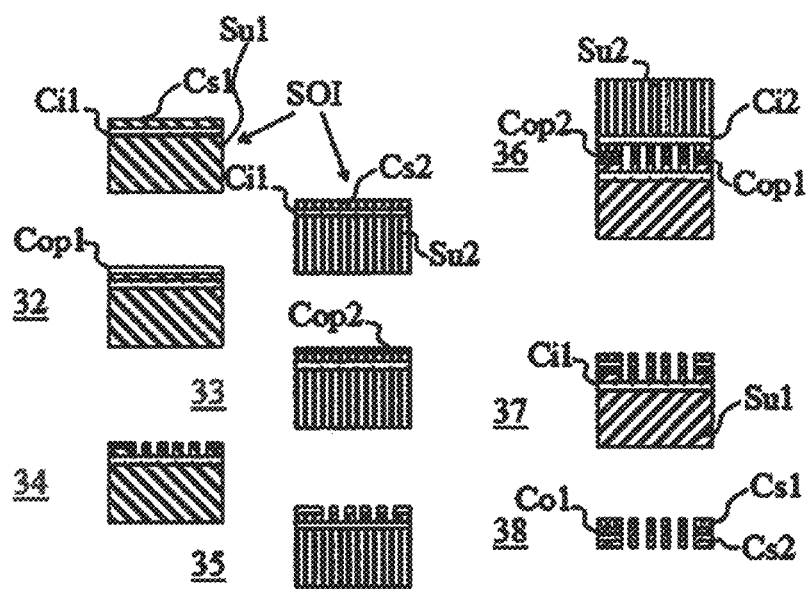

FIG. 8 illustrates an implementation process that also uses two SOI wafers. In steps (32 and 33), two parts (Cop1, Cop2) of the thermal compensation layer (Co1) are deposited respectively on each silicon layer (Cs1, Cs2) of the two SOI wafers.

In steps (34 and 35), the patterns of the oscillator are then etched onto the two parts (Cop1 and Cop2) of the thermal compensation layer (Co1), as well as onto the two silicon layers (Cs1, Cs2) of the two wafers. In a step (36), the two parts (Cop1, Cop2) are then sealed with a 45° offset between the wafers, so as to form the complete thermal compensation layer (Co1). Steps (37, 38) consist in removing the two substrates (Su1, Su2), as well as the two insulator layers (Ci1, Ci2), to release the mechanical oscillator.

Figure 9:
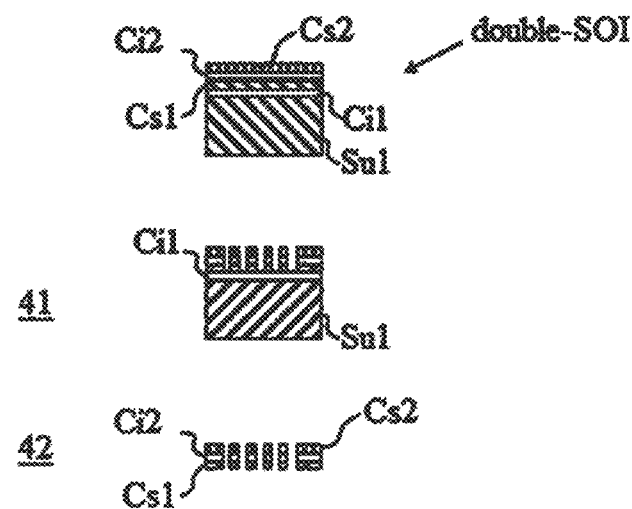

FIG. 9 illustrates an implementation process using a single dual-SOI wafer. A dual-SOI wafer consists of a substrate (Su1) topped by a first insulator layer (C1), a first monocrystalline silicon layer (Si1), a second insulator layer (Ci2) followed by a second monocrystalline silicon layer (Si2). The second insulator layer (Ci2) thus fulfills the function of the thermal compensation layer (Co1) of the strip (11). The first silicon layer (Cs1) and the second silicon layer (Cs2) incorporates crystal lattices of which the directions are offset by a 45° angle. A first step (41) consists of etching the pattern of the mechanical oscillator onto the first silicon layer (Cs1), the second insulator layer (Ci2) and the second silicon layer (Cs2). A second step (42) consists in removing the substrate (Su1) and the first insulator layer (Ci1), to release the mechanical oscillator.

Figure 10:
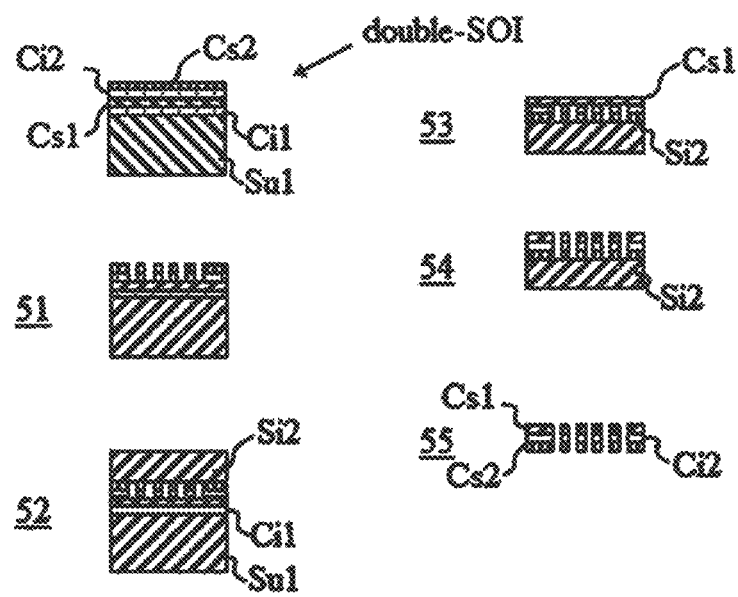

FIG. 10 illustrates a variant of the process in FIG. 9, using a dual-SOI wafer. A first step (51) consists in etching the pattern of the mechanical oscillator onto the second silicon layer (Cs2) and the second insulator layer (Ci2). In a second step (52), a silicon wafer (Si2) is sealed onto the second silicon layer (Cs2). This silicon wafer (Si2) is a sacrificial layer that only acts as a medium for the structure, and it is eliminated in a subsequent step. In a step (53), the assembly is turned over, and the substrate (Su1) and the first insulating layer (Ci1) of the first wafer are removed. The pattern of the mechanical oscillator is etched on the first silicon layer (Cs1) in a step (54) and in a step (55) the silicon wafer (Si2) is removed, to release the mechanical oscillator.

This variant of the process in FIG. 9 can be implemented when the strip (11) is too thick and the etching step (41) does not enable the first silicon layer (Cs1) to be etched properly.

Figure 11:
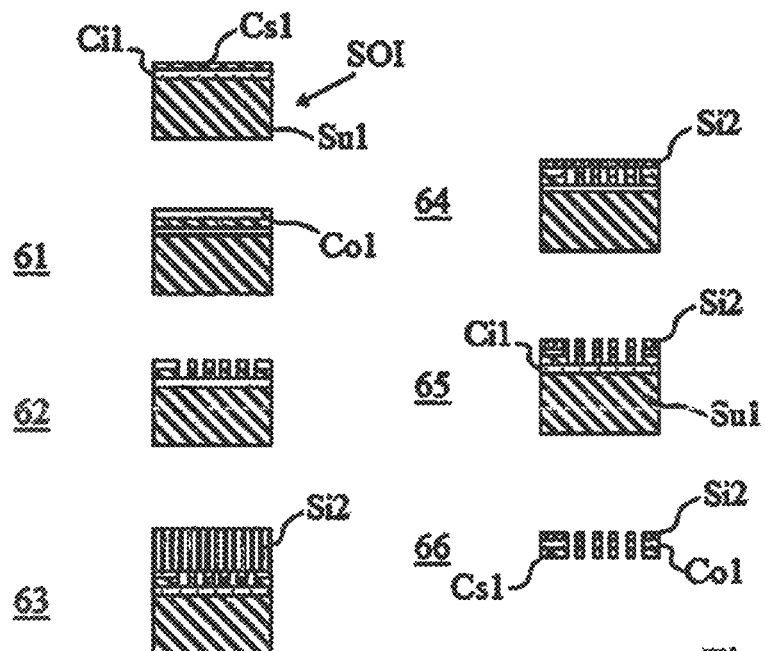

FIG. 11 illustrates an implementation process using an SOI wafer and a silicon wafer (Si2). In a first step (61), a thermal compensation layer (Co1) is deposited on the silicon layer (Cs1) of the first SOI wafer. In a second step (62), a pattern of the mechanical oscillator is etched onto the thermal compensation layer (Co1) and onto the silicon layer (Cs1). The silicon wafer (Si2) is then sealed with a 45° offset onto the thermal compensation layer (Co1) in a step (63). Step (64) consists in thinning the silicon wafer (Si2) until the height hs2 desired for the second silicon layer (Cs2) of the strip (11) of FIG. 1 is attained. In a step (65), the pattern of the mechanical oscillator is etched on the second silicon layer (Cs2) formed by the silicon wafer (Si2) and, in a step (66), the substrate (Su1) and the insulator layer (Ci1) are removed, to release the mechanical oscillator.

Figure 12:
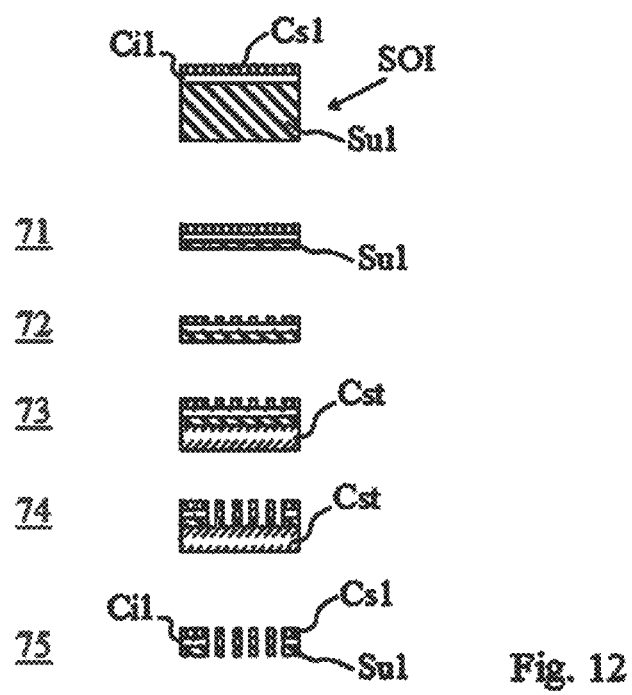

FIG. 12 illustrates an implementation process using a single wafer of SOI type, in which the substrate (Su1) is made of silicon and forms the second silicon layer (Cs2) of FIG. 1. The thermal compensation layer (Co1) is formed by the insulator layer (Ci1), which is preferably made of silicon oxide. A first step (71) consists in thinning the substrate (Su1) until the desired height hs2 for the second silicon layer (Cs2) of the strip (11) of FIG. 1 is attained. In a step (72), the pattern of the mechanical oscillator is etched on the silicon layer (Cs1). A structuring layer (Cst) is then deposited on the thinned substrate (Su1) in a step (73) to stiffen the structure, and then the pattern of the mechanical oscillator is etched onto the insulator (Ci1) and substrate (Su1) layers in a step (74). In a step (75), the structuring layer (Cst) is removed, to release the mechanical oscillator.

A variant of these processes can be adapted to implement one of the variants of FIGS. 4 to 6. For example, an outer thermal compensation layer (Coe) can be manufactured in a silicon oxidation chamber, thus forming a layer of silicon oxide around the strip (11). A second thermal compensation layer (Co2) and a third silicon layer (Cs3) can be manufactured—for example, by sealing a third wafer of silicon-on-insulator type, and by performing corresponding additional etching steps. The disclosed embodiments thus make it possible to procure a mechanical oscillator of which the stiffness is isotropic within the plane and independent of temperature, without increasing the size of the strip, and without using an isotropic silicon layer in the plane.

The invention claimed is:

1. A mechanical oscillator endowed with a strip, the strip comprising:
   a first silicon layer having a crystal lattice extending along a first direction of a plane; and
   a thermal compensation layer made of a material having a thermal coefficient of the Young's modulus of opposite sign to that of the silicon;
   wherein the strip also comprises a second silicon layer having a crystal lattice extending along a second direction of the plane,
   the first and the second direction being offset by an angle of 45° within the plane of the layers, and
   the thermal compensation layer extending between the first and second silicon layers.

2. A mechanical oscillator according to claim 1, wherein the strip comprises:
   a third silicon layer comprising a crystal lattice extending in a third direction parallel to the direction of the first silicon layer; and
   a second thermal compensation layer made of a material having a thermal coefficient of the Young's modulus of opposite sign to that of the silicon;
   with each thermal compensation layer being located between two superposed silicon layers;
   with the direction of the second silicon layer located between the two other silicon layers being offset by an angle of 45° in relation to the direction of the other two silicon layers.

3. A mechanical oscillator according to claim 1, wherein the strip comprises an outer thermal compensation layer made of a material having a Young's modulus thermal coefficient of opposite sign to that of the silicon.

4. A mechanical oscillator according to claim 1, wherein the thermal compensation layer, of which the material has a thermal coefficient of the Young's modulus of opposite sign to that of the silicon, is manufactured in Silicon oxide.

5. A mechanical oscillator according to claim 1, wherein the volume ratio between the material having a Young's modulus thermal coefficient of opposite sign to that of the silicon and the silicon layers is between 20% and 30% at an ambient temperature of approximately 20° C.

6. A mechanical oscillator according to claim 1, wherein the mechanical oscillator is a spiral spring designed to equip the rocker arm of a mechanical clockwork assembly and formed from a spiral strip.

7. A method for manufacturing a mechanical oscillator endowed with a strip comprising a first silicon layer having a crystal lattice extending along a first direction of a plane, a thermal compensation layer made of a material having a thermal coefficient of the Young's modulus of opposite sign to that of the silicon, wherein the strip also comprises a second silicon layer having a crystal lattice extending along a second direction of the plane, the first and second direction being offset by an angle of 45° within the plane of the layers and the thermal compensation layer extending between the first and second silicon layers, the method comprising:
   etching a pattern of the mechanical oscillator onto the first silicon layer and onto the thermal compensation layer and the second silicon layer.

8. A method for manufacturing a mechanical oscillator in accordance with claim 7, the method further comprising:
   depositing a thermal compensation layer on a first silicon layer of a first silicon-on-insulator wafer;
   etching the pattern of the mechanical oscillator onto the thermal compensation layer and onto the first silicon layer of the first silicon-on-insulator wafer;
   sealing a second silicon-on-insulator wafer onto the first silicon wafer, with a rotation of 45° in relation to the first silicon wafer, such that a second silicon layer of the second silicon wafer is in contact with the thermal compensation layer;
   removing a substrate and an insulator layer of the first silicon-on-insulator wafer;
   etching the second silicon layer of the second silicon wafer, using the first silicon layer as a mask; and
   removing a substrate and an insulator layer of the second silicon-on-insulator wafer;
   the first and second silicon-on-insulator silicon wafer consisting of a substrate topped by an insulator layer followed by one of the aforesaid first or second monocrystalline silicon layers.

9. A method for manufacturing a mechanical oscillator in accordance with claim 7, the method further comprising:
   depositing a first part of a thermal compensation layer onto a first silicon layer of a first silicon-on-insulator wafer;
   depositing a second part of the thermal compensation layer onto a second silicon layer of a second silicon-on-insulator wafer;
   etching the pattern of the mechanical oscillator onto the first part (Cop1) of the thermal compensation layer, and onto the first silicon layer of the first silicon-on-insulator wafer;
   etching the mechanical oscillator pattern onto the second part of the thermal compensation layer, and onto the second silicon layer of the second silicon-on-insulator wafer;
   sealing the second silicon wafer onto the first silicon wafer, with a rotation of 45° in relation to the first silicon wafer, such that the two parts of the thermal compensation layer are in contact;
   removing a substrate and an insulator layer of the second silicon-on-insulator wafer; and
   removing a substrate and an insulator layer of the first silicon-on-insulator wafer;
   the first and second silicon-on-insulator wafers consisting of a substrate topped by an insulator layer followed by one of the aforesaid first or second monocrystalline silicon layers.

10. A method for manufacturing a mechanical oscillator in accordance with claim 7, the method further comprising:
    etching the pattern of the mechanical oscillator onto a first silicon layer, a second insulator layer and a second silicon layer of a silicon wafer of dual silicon-on-insulator type; and
    removing a substrate and a first insulator layer of the silicon wafer;

with the first silicon-on-insulator wafer consisting of a substrate toped by a first insulator layer, a first monocrystalline silicon layer of a second insulating layer followed by a second monocrystalline silicon layer, with the first and second silicon layers of the dual silicon-on-insulator wafer comprising crystal lattices of which the directions are offset at an angle of 45°.

11. A method for manufacturing a mechanical oscillator in accordance with claim 7, the method further comprising:
    etching the pattern of the mechanical oscillator onto a second silicon layer and a second insulator layer of a first dual silicon-on-insulator wafer;
    sealing a second silicon wafer onto the second silicon layer of the first silicon wafer;
    removing a substrate and a first insulator layer of the first silicon wafer;
    etching the pattern of the mechanical oscillator onto a first silicon layer of the first silicon wafer; and
    removing the second silicon wafer;
    with the first dual silicon-on-insulator wafer consisting of a substrate topped by a first insulator layer, a first monocrystalline silicon layer, a second insulator layer followed by a second monocrystalline silicon layer, with the first and second silicon layers of the dual silicon-on-insulator wafer comprising crystal lattices of which the directions are offset at an angle of 45°;
    with the second silicon wafer being composed of a single silicon layer that may or may not be topped by an insulating layer.

12. A method for manufacturing a mechanical oscillator in accordance with claim 7, the method further comprising:
    depositing a thermal compensation layer on a silicon layer of a first silicon-on-insulator wafer;
    etching the pattern of the mechanical oscillator onto the thermal compensation layer and onto the silicon layer of the first silicon wafer;
    sealing a second silicon wafer comprising the aforesaid second silicon layer onto the first silicon wafer, with a rotation of 45° in relation to the first silicon wafer, such that the second silicon wafer is in contact with the thermal compensation layer;
    thinning the second silicon wafer;
    etch the pattern of the mechanical oscillator onto the second silicon wafer; and
    removing a substrate and an insulator layer of the first silicon wafer;
    with the first silicon-on-insulator wafer consisting of a substrate topped by an insulator layer followed by a monocrystalline silicon layer;
    with the second silicon wafer being composed of a single silicon layer that may or may not be topped by an insulating layer.

13. A method for manufacturing a mechanical oscillator in accordance with claim 7, the method further comprising:
    thinning a substrate forming the aforesaid second silicon layer of a silicon-on-insulator wafer;
    etching the pattern of the mechanical oscillator onto a silicon layer of the silicon wafer;
    depositing a structuring layer onto the substrate of the silicon wafer;
    etching the pattern of the mechanical oscillator onto a substrate and an insulator layer of the silicon wafer, using the first silicon layer as a mask; and
    removing the structuring layer of the substrate of the silicon wafer;
    with the silicon-on-insulator wafer consisting of a silicon substrate topped by an insulator layer followed by a monocrystalline silicon layer, with the first silicon layer and the silicon substrate of the silicon-on-insulator wafer having crystal lattices of which the directions are offset at a 45° angle.

14. A method for manufacturing a mechanical oscillator in accordance with claim 8, further comprising an additional step of oxidation of the strip.

15. A method for manufacturing a mechanical oscillator in accordance with claim 8, further comprising an additional step consisting in affixing a second thermal compensation layer and a third silicon layer.

* * * * *

UNITED STATES PATENT AND TRADEMARK OFFICE
CERTIFICATE OF CORRECTION

PATENT NO. : 10,095,184 B2  
APPLICATION NO. : 15/544754  
DATED : October 9, 2018  
INVENTOR(S) : Vincent Gaff et al.

Page 1 of 1

It is certified that error appears in the above-identified patent and that said Letters Patent is hereby corrected as shown below:

On the Title Page

Item (71), Line 1, "TRONICS'S" should be -- TRONIC'S --.

Item (57), Line 8, "and direction" should be -- and second direction --.

Signed and Sealed this  
Sixth Day of April, 2021

Drew Hirshfeld  
*Performing the Functions and Duties of the*  
*Under Secretary of Commerce for Intellectual Property and*  
*Director of the United States Patent and Trademark Office*